(12) United States Patent
Filippini

(10) Patent No.: US 12,071,366 B2
(45) Date of Patent: Aug. 27, 2024

(54) APPARATUS AND METHOD FOR APPLYING PAINT WITH ROLLER COATERS, PREFERABLY TO PHOTOVOLTAIC PANELS

(71) Applicant: CEFLA Società Cooperativa, Imola (IT)

(72) Inventor: Fabrizio Filippini, Imola (IT)

(*) Notice: Subject to any disclaimer, the term of this patent is extended or adjusted under 35 U.S.C. 154(b) by 0 days.

(21) Appl. No.: 17/744,877

(22) Filed: May 16, 2022

(65) Prior Publication Data
US 2022/0371947 A1    Nov. 24, 2022

(30) Foreign Application Priority Data

May 20, 2021  (IT) .................... 102021000013091

(51) Int. Cl.
*C03C 17/00*     (2006.01)
*H01L 21/67*     (2006.01)

(52) U.S. Cl.
CPC ...... *C03C 17/002* (2013.01); *H01L 21/67259* (2013.01); *C03C 2218/118* (2013.01)

(58) Field of Classification Search
None
See application file for complete search history.

(56) References Cited

U.S. PATENT DOCUMENTS

| | | |
|---|---|---|
| 9,314,811 B1 | 4/2016 | Brophy et al. |
| 2005/0039342 A1 | 2/2005 | Kirstine |
| 2011/0235055 A1* | 9/2011 | Buehler ................. G01N 21/95 219/385 |

FOREIGN PATENT DOCUMENTS

| | | |
|---|---|---|
| CN | 112604885 A | 4/2021 |
| JP | 2016044970 A * | 4/2016 |

* cited by examiner

*Primary Examiner* — Alexander M Weddle
(74) *Attorney, Agent, or Firm* — Themis Law

(57) ABSTRACT

A bridge device for measuring the thickness of mainly flat panels to be placed in a panel production line includes a frame having feet for fixing the bridge device to the floor; a plurality of supports that support measuring contact systems, which are slidable perpendicularly to the conveying direction of the panels so to adjust their positions for a transversal measure of the panels; a plurality of measuring contact systems, of which is one is for each longitudinal side of the panels; a photocell detecting the position of the panels and their lengths; blocking knobs for blocking the supports; and a device transmitting the information concerning the actual thickness of each panel to a machine for treating one of the main surfaces of the panel.

15 Claims, 9 Drawing Sheets

APPARATUS AND METHOD FOR APPLYING PAINT WITH ROLLER COATERS, PREFERABLY TO PHOTOVOLTAIC PANELS

FIELD OF THE INVENTION

The present invention relates to an apparatus and a method for applying paint through roller coaters to mainly flat panels. In particular, said apparatus provides for the replacement of the applying roller in said apparatus. In the case of solar (photovoltaic) panels said mainly flat panels are glass panes. Moreover, said apparatus and method allow the precise measuring of the thickness of said glass panes or anyway of the panels painted through said roller coater, and to adjust the application head to the thickness measured for each panel or pane.

BACKGROUND OF THE INVENTION

Mainly flat panels means panels wherein two of the three dimensions are bigger than the third dimension, by at least one order of magnitude. Typically, the measures of said glass panes are 600×600×1.5 mm to 2000×1400×3 mm.

Typically, an apparatus for applying paint on products using the roller technology is provided with a conveying system, on which panels to be painted are laying. The panels are brought near the application head, made of two rollers: a first chromed dosing roller and a second rubber applying roller. A pump withdraws paint from a tank, and paint is conveyed to a tank formed by said pair of rollers, which are pressurized.

The transposition of paint from the applying roller onto the panel occurs through pressure. The quantity of paint is adjusted through the variation of the pressure applied on the applying roller by the dosing roller. Advantageously, a load cell system can be used, measuring the thrust force of the dosing roller onto the applying roller.

In the art, using reading bars is known in order to detect the actual measures of said panels to be painted, in particular their thickness.

One of the documents of the known art is, e.g., U.S. Pat. No. 9,314,811B1 to Enki Technology Inc. disclosing an apparatus for applying a sol-gel coating on solar panels. Said apparatus comprises an applying station for applying a coating through rollers, and a station for gelling the applied coating.

The apparatuses for painting solar panels on the market are affected by the recurring problem of replacing the applying roller. It is known that the application of paint on such panels requires a high precision of both the quantity and the uniformity of the applied paint layer.

To this aim, a special applying roller must be used, which is lined with a polyurethane elastomer, provided with a finely rectified surface, which is easily damaged. Therefore, the applying roller must be often replaced in order to work and produce with the indispensable quality. In addition to the normal wear, said applying roller enters into contact with the sharp edges of glass panes, which can easily damage it.

On the market there are provided apparatuses of this kind, but due to their built none of the existing apparatuses can allow a fast replacement of the applying roller without the removal of the covers needed to protect human operators from the dangerous contact with the different rotating mechanical parts. In fact, in order to accelerate maintenance times, during the replacement of the applying roller, many of the machines available on the market expose dangerous rotating mechanical parts in order to avoid the time-consuming removal of protective covers.

Moreover, it is known that the glass panes to be painted can be provided with a thickness slightly different on their external sides, i.e., the sides parallel to the conveying direction (left and right side). For example, a glass pane can be 3 mm thick on the right side and 2.8 mm thick on the left side: this difference can prevent the precise application of paint.

Devices for measuring the thickness of glass panes are known.

US2011/0235055A1 to First Solar Inc. describes a system for determining a thickness of a photovoltaic module comprising a first displacement sensor and a second displacement sensor along a shared axis. The system may also include a support structure that supports the first and second displacement sensors and locates the sensors on either side of the photovoltaic module. In other words, the document discloses a single pair of sensors that can be moved along any position of the panel.

US2005/0039342A1 to Trask Britt describes an apparatus comprising one or more pairs of mutually coaxial and opposing linear measuring devices including movable, biased fingers for simultaneously determining the thickness and warpage of a substrate such as a circuit board passing between said fingers. Each measuring device is calibrated to a zero point by bringing the ends of the movable fingers together and recording the distance or position thereof. Data for computation of substrate thickness and warpage measurements is obtained by recording displacement distances or positions of the movable fingers in contact with opposing surfaces of the substrate with respect to the zero point, the thickness and warpage then being calculated. The apparatus may be integrated with an assembly line, including incorporation with an existing piece of equipment, so that substrates exhibiting out-of-specification thickness or excessive warpage may be reworked, discarded or downgraded during the manufacturing process. Said document discloses at least two pair of sensors for measuring the panel thickness, that cannot be moved with respect to the direction of width of the panel.

CN112604885A to Shanxi Rishengda Solar Tech Co Ltd describes a photovoltaic glass coating system. The technical problems of low light transmittance and the like of traditional single-layer coating are solved. The photovoltaic glass coating system comprises a spraying system and a roller coating system, wherein the spraying system and the roller coating system are sequentially arranged above a photovoltaic glass conveying rail behind an annealing furnace in the photovoltaic glass conveying direction. The spraying system comprises a machine frame, two groups of spraying devices, two groups of conveying devices, an exhaust device, a monitoring device and a control system. The roller coating system comprises an engraving roller, a coating roller and a grain-eliminating roller, and the engraving roller, the coating roller and the grain-eliminating roller are matched with one another to perform roller coating on photovoltaic glass. The spraying system is additionally arranged before roller coating of the roller coating system, double layers of antireflection films are achieved, and the light transmittance of the glass is improved, so that the power generation efficiency of solar cells is improved.

For instance, using a small roller placed at the entry of the application head is known. Nonetheless, such device is affected by some drawbacks. The detrimental effect linked to the rolling of the small roller on the glass surface must be accounted for, which introduces measuring mistakes due to concentricity and hopping. Moreover, as said small roller works leaning on the top surface of the glass pane, which is conveyed by the conveying belt, deformations both of the glass pane and of the conveying belt can make such measuring imprecise and unsteady.

SUMMARY OF THE INVENTION

Aim of the present invention is providing an apparatus and a fast and cheap method for the replacing of applying rollers, allowing human operators to work safely on the roller coater.

A further aim of the present invention is providing an apparatus and a method for precisely measuring the thickness of said glass panes, allowing an easy and fast adjusting of the position of the application head with respect to the single glass pane.

This object is achieved by an apparatus and a method having the features of the independent claims. Advantageous embodiments and refinements are specified in claims dependent thereon.

The apparatus according to the present invention comprises an applying roller supported by suitable lifting systems, which roller can be lifted without touching any mechanical part and without the need for removing further covers. Said lifting must occur during downtimes, when the roller coater is not applying paint.

In the apparatus according to the present invention, the rotating systems are protected through protective and guarded covers, so that dangerous parts cannot be reached, with the exception of the adjusting organs needed for adjustments. A multifunctional Programmable Logic Controller (PLC) provided with a display allows to adjust and control all the working parameters.

In a second, more sophisticated embodiment, the apparatus comprises a bridge device, in its turn comprising two measuring systems of the thickness of the glass pane to be measured. Therefore, the apparatus according to this second embodiment is provided with two measuring systems, one on each external side (i.e., right and left side) said sides being the sides oriented in the conveying direction of the pane of the glass pane, mounted on said bridge support, which is an accessory of the roller coater. Said bridge device can be placed in different points of the production line with the aim of measuring the thickness of the glass panes and of correspondingly adjusting the inclination of the application head to the specific glass pane to be painted. Obviously, said bridge device must be placed upstream the roller coater, preferably in its immediate proximity. Said bridge device comprises two measuring systems, provided with centesimal precision, which can be manually moved in the direction of the width of the glass pane in order to adjust the measuring system to the different widths of said glass panes. The bridge device is provided with suitable photocell systems for managing a suitable automation. Obviously, this entails the painting of a painting batch wherein al the glass panes are provided with the same width.

In this second embodiment, in addition to the bridge device for measuring the pane thickness through the measuring of said thickness along the two longitudinal, lateral sides of the pane, i.e., the sides oriented in the pane conveying direction, there is provided also a system for adjusting the application head that is divided into a control part and a transmission part, provided with two independent motoring. Said transmission part is managed by brushless motors and movements on ball recirculating runners, capable of reaching centesimal precision in their positioning.

In this way, the transversal position of the application head can be adjusted in the direction of the width to the single glass pane to be painted, in order to adjust it to the difference of thickness between the two lateral, longitudinal sides of said single glass pane, i.e., the lateral sides oriented in the conveying direction.

A first advantage of the present invention consists in the fast replacement of the applying roller, while preserving the safety of human operators. Of course, the replacement must occur during downtimes: the fast replacement allows the shortening of said downtimes.

A second advantage of the present invention is linked to the fact that the roller coater works with a perfectly efficient applying roller, so that glass panes can be perfectly painted, preventing the production of nonconforming products.

A third advantage, linked to the second embodiment measuring the thickness of said glass pane, is the possibility of applying a perfectly uniform layer of paint on all glass panes, even when said glass pane is provided with a non-uniform thickness along its length and/or its width.

With respect to the second embodiment, the two systems measuring the thickness can comprise one sensor, respectively, for each lateral, longitudinal side of the pane, which are cooperating with just one face of the pane.

In an embodiment, there are provided systems for measuring the thickness along two lateral, longitudinal sides of the pane, and comprising, for each lateral, longitudinal side, a pair of opposed sensors, each sensor cooperating with one or the other face of the pane. In this case, there are provided two measuring systems, overall provided with four sensors, two cooperating with one face of the pane and two cooperating with the opposed face of the pane.

In a further embodiment, there is provided just one measuring system of pane thickness. The system comprising said pair of sensors is aimed at cooperating with one respective lateral, longitudinal side of the pane, and comprises a pair of two opposed sensitive elements, intended to cooperate for detecting the thickness of the pane along the same lateral, longitudinal side, e.g., a pair of elements comprising an emitter and a receiver placed on the opposed faces of the pane. In this case, the measuring occurs through just one measuring system, comprising two opposed measuring element and provided coupled to the opposed faces of the pane.

Concerning the kind of measuring systems and/or sensitive elements, preferably they are contact sensors, like, e.g., feelers or the like. Said embodiment is widely shown and described in the present invention of the preferred embodiments. Nonetheless, the sensors of the measuring systems also comprise alternatives of the type not in contact with the pane surface. These are equivalent solutions that are part of the common general knowledge of the skilled man, which can be chosen and used by said skilled man, without exercising any inventive activity.

BRIEF DESCRIPTION OF THE DRAWINGS

Further advantages and properties of the present invention are disclosed in the following description, in which exemplary embodiments of the present invention are explained in detail on the basis of the drawings.

DETAILED DESCRIPTION OF EMBODIMENTS OF THE INVENTION

It is worth remembering that, although the present description refers to the painting of glass panes, the description can be applied to the painting of panels made of any kind of material. When panels material is not transparent, optical sensors can be a good option.

It is also worth remembering that the roller coater indicated with the numeral 1 is generally a component of a more complex painting line, comprising other sundry (not shown) apparatuses placed upstream and downstream said roller coater 1. For example, upstream said apparatus 1 there can be provided apparatuses for the pre-treatment of panels, while downstream there can be provided further apparatuses for applying further paint layers and/or ovens for drying/polymerizing the applied paint.

Figure 1:
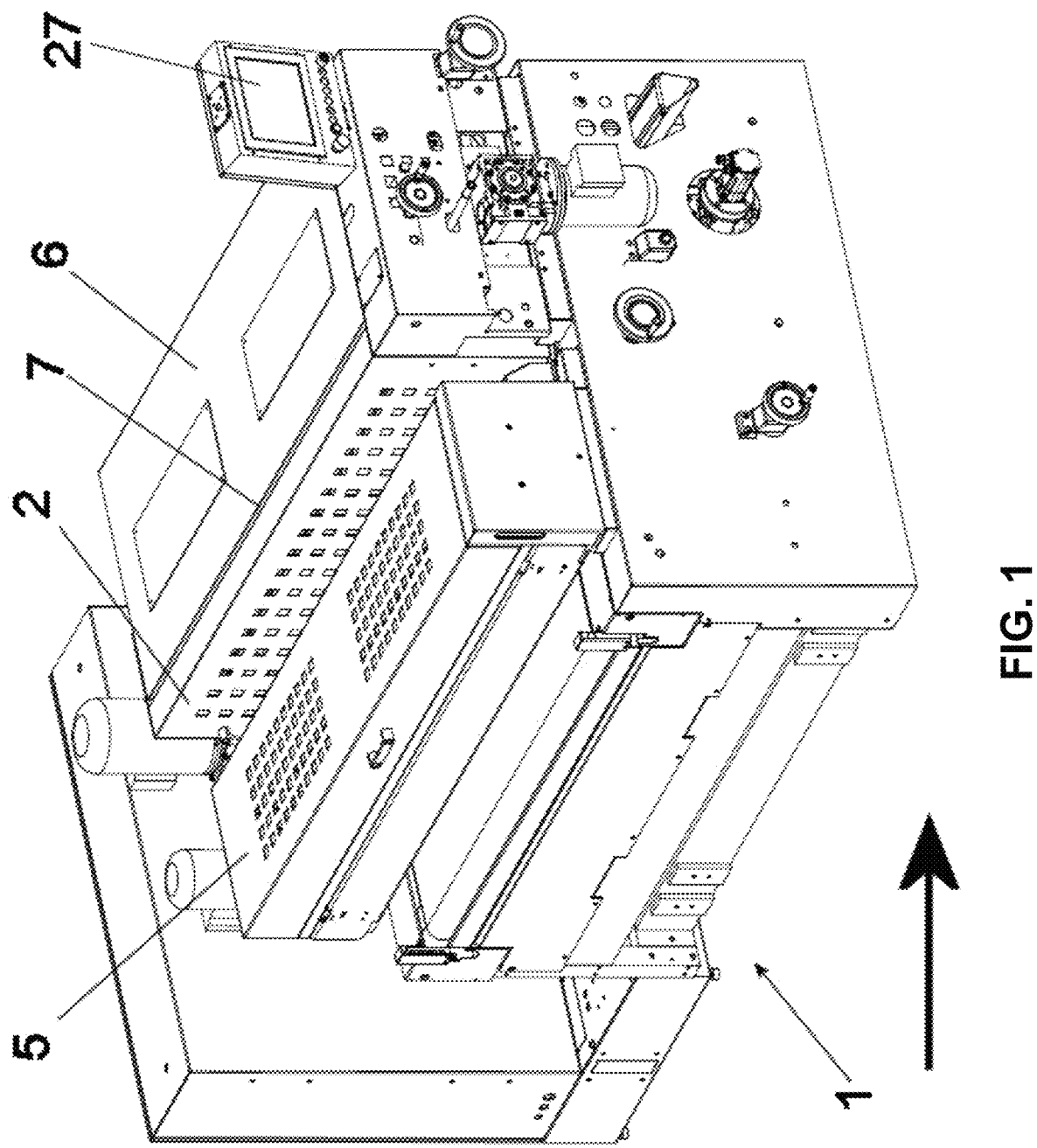
FIG. 1 is an axonometric view of the apparatus with cover.

FIG. 1 shows a roller coater 1 provided with the covers needed for its functioning without risk for human operators, as prescribed by the Machinery Directive 2006/42/CE. The bold arrow shows the conveying direction of the glass panes to be painted. In particular, the roller coater 1 is provided with a cover 2 that is to be removed in order to reach an applying roller 3. For safety reasons, the cover is screwed with two screws to said roller coater 1, screws that can be removed through an ordinary tool. Normally said roller coater 1 is provided with a PLC 27 having an interface that allows a human operator both to modify the set-up of the apparatus, and to detect the working parameters of said roller coater 1.

Figure 2:
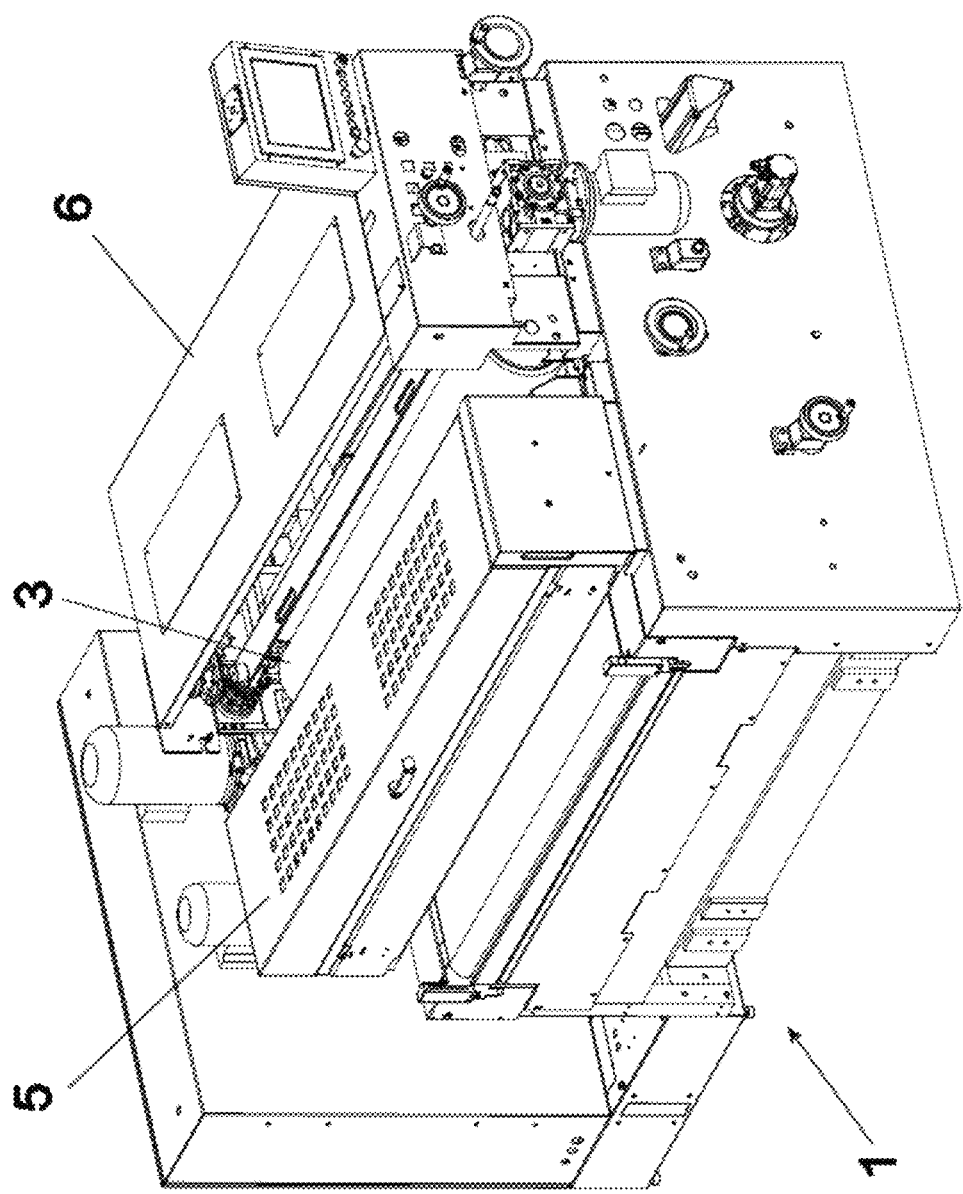
FIG. 2 is an axonometric view of the apparatus, wherein a cover was removed, and applying roller in its working position.

FIG. 2 shows the roller coater 1, wherein said cover 2 was removed and the applying roller 3 in its working position. Said vertical cover 2 covers the applying roller 3. A horizontal cover 6 covers both the applying roller 3 and a dosing roller 11 (visible in FIG. 4). Said applying roller 3 and said dosing roller 11 form an application head.

Figure 8:
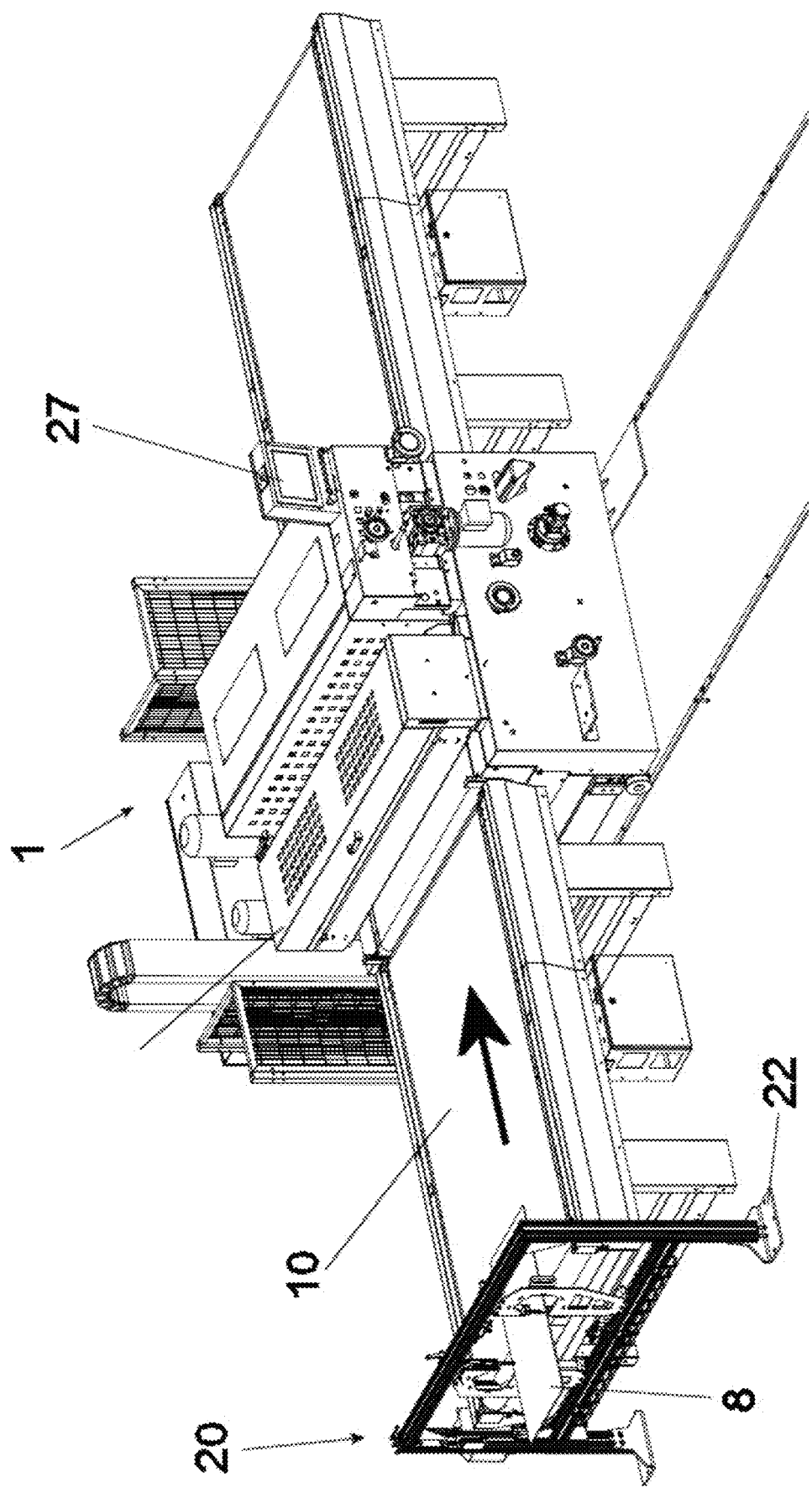
FIG. 8 is an axonometric view of the roller coater provided with a bridge device for measuring panels thickness.

The dosing roller 11 rotates in the conveying direction of the glass pane 8 (visible in FIG. 8). The applying roller 3 is a reverse roller, i.e., rotates in the opposite direction with respect to the conveying of the panes to be painted, and would tend to repel the glass pane, i.e., send it back to its place of origin.

In order to prevent this, in the art using a feed roller 9 is known (visible in FIG. 4), which rotates according to the conveying direction of the panes, and therefore provides for the conveying of the glass pane 8. A further cover 5 covers said feed roller 9.

It is worth mentioning that the interaxis between said feed roller 9 and the applying roller 3 must be shorter than the minimum length of the shortest glass panel that can be coated in said roller coater. In this case, the distance is 600 mm.

Figure 3:
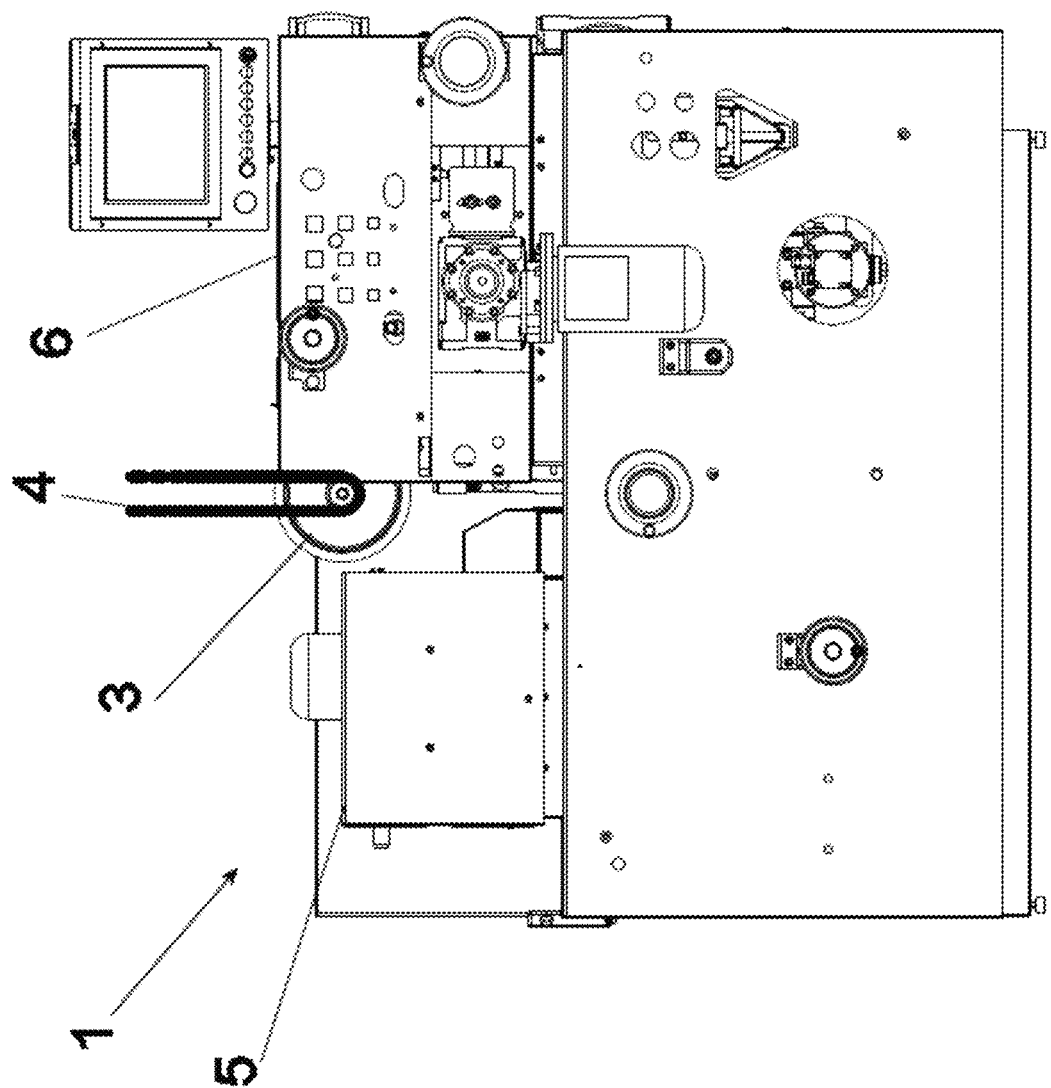
FIG. 3 is a lateral view of the apparatus, wherein a cover was removed, and applying roller in the extraction position.

FIG. 3 shows a lateral view of said roller coater 1, while said applying roller 3 is extracted through two straps 4, each placed at one of its two ends. Said straps 4 are part of a lifting member, suitable for the weight of said roller 3, which is around 200 kg. Said lifting member can be a bridge crane or a stacker, placed in a suitable point; the lifting member is independent from said roller coater 1. Said lifting member is used also for inserting a new applying roller 3 into said roller coater 1, in order to replace said worn/damaged roller 3. Obviously, the roller 3 can be replaced only when said roller coater is stopped (during downtimes).

The positions of the rollers and of the covers of the roller coater 1 must be such, that the applying roller 3 can be extracted without entering into contact with other mechanical parts of the coater 1.

The dosing roller 11 undergoes a markedly lesser wear with respect to the applying roller 3. When the dosing roller 11 must be replaced, the top cover 6 is removed, which opens like a door through a hinge 7 placed at the end of said cover 6 oriented to the entry of said panes.

Figure 4:
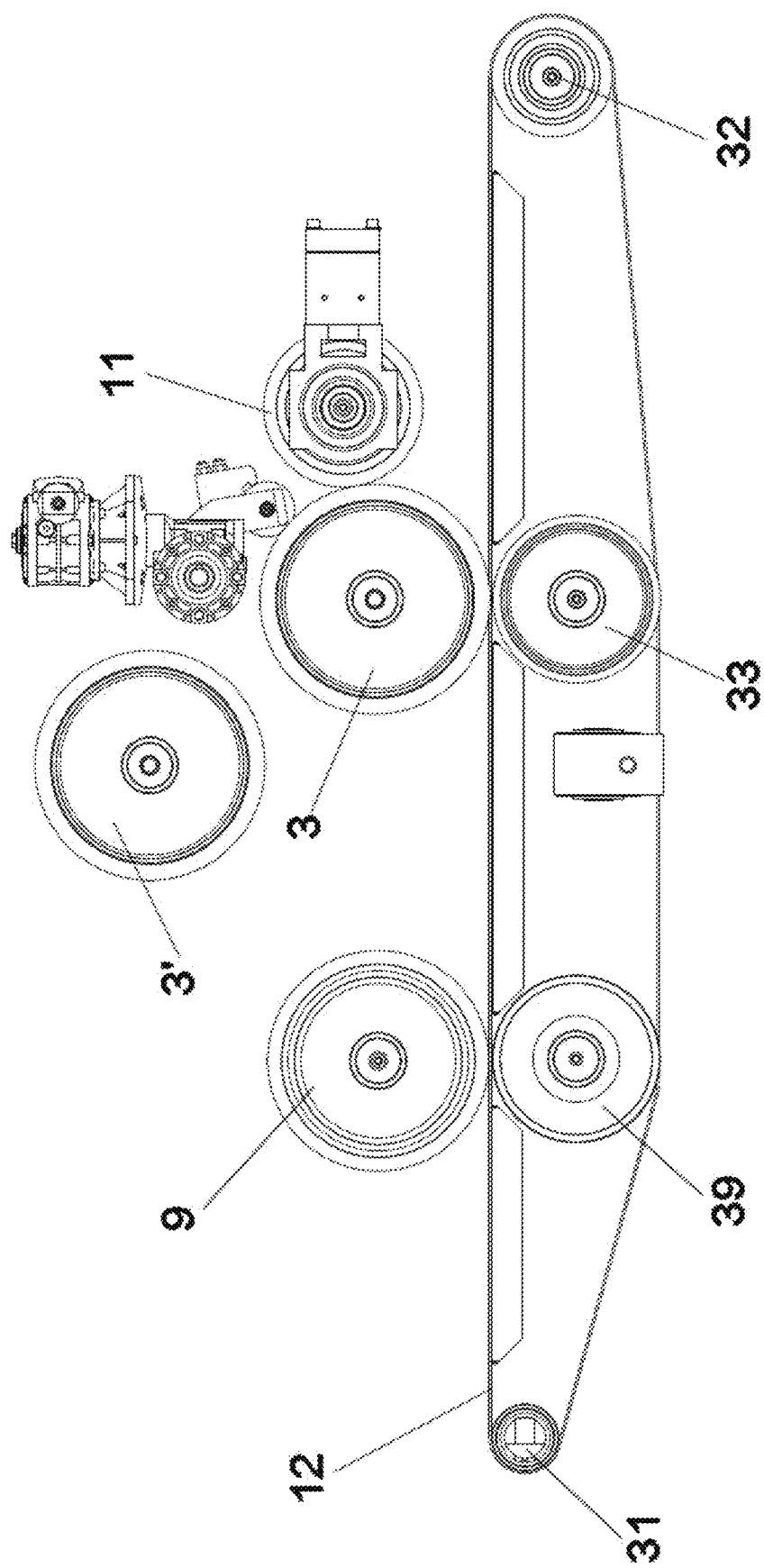
FIG. 4 is a lateral view of the apparatus without covers.

FIG. 4 shows a lateral view of the roller coater 1, wherein the covers 2, 5 and 6 were removed. Said removal allows to observe the feed roller 9, which in use is hidden by said cover 5, the applying roller 3 and the dosing roller 11, which together form the application head, in use hidden by said cover 6. For comparison, the roller indicated with the numeral 3' shows the position for the vertical extraction of said roller 3. In other words, the roller indicated with 3' is in the extraction position shown in FIG. 3.

As customary in the art, the feed roller 9 rotates in the conveying direction of the glass panes, and is coupled to a contrast roller 39. The applying roller 3 is a reverse roller and rotates in the direction opposite to the conveying direction. The dosing roller 11 rotates in the conveying direction.

FIG. 4 allows to observe also a closed belt conveyor 12, which is a component of the roller coater 1. Said conveyor 12 is rectified; as customary, the closed belt rotates around two rollers, the first of which is an idle roller 31, while the second roller is a motorized roller 32.

As explained, the applying roller 3 is a reverse roller, i.e., tends to repel the glass pane 8, therefore there must be provided said feed roller 9, which forces the pane across the applying roller 3 and the contrast roller 33. The contrast roller 33 can be moved in the conveying direction, so that when it is moved from the vertical position with respect to the applying roller 3, a too violent contact with the entry edge of the glass pane 8 is prevented.

The conveying belt 12 is rectified in order to prevent surface bulging, due e.g., to a vulcanized joint, so as to prevent thickness differences along the belt. In fact, said differences in thickness provoke a difference of pressure of the applying roller 3, and therefore a difference in the thickness of applied paint.

The feed roller 9 presses on the glass pane 8 with an interference of about 0.5 mm. The glass pane 8 is intercepted by a photocell at the entry of the roller coater 1, which accompanies it until said pane is held between said applying roller 3 and contrast roller 33, with an interference of 0.5 mm again. The feed roller lifts from the glass pane 8 and the pane is dragged by the belt, in order to prevent vibrations during paint application.

Figure 5:
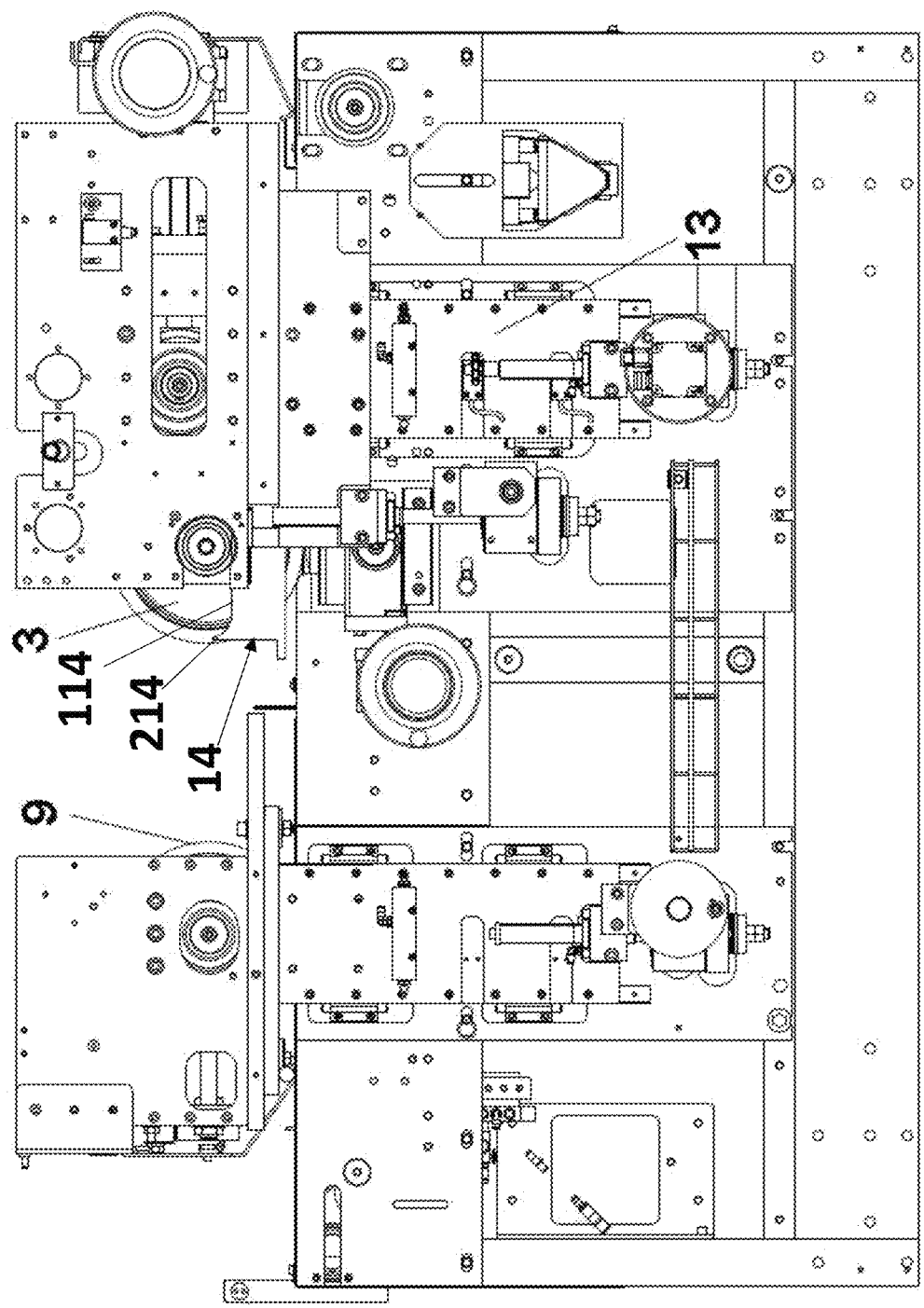
FIG. 5 is a lateral view of the supporting system for rollers.

FIG. 5 shows a lateral view wherein all the covers were removed, and the support systems of said rollers are shown.

Said application head, comprising applying roller 3 and dosing roller 11, moves with respect to the conveying belt 12 through two independent systems 13 provided with ball recirculating runners, one system on the right side and one system on the left side. In this way, it can adjust to the actual dimensions of the thickness of the glass pane 8, which can be different on the two sides for some tenths of millimetre. The motorization is provided with brushless motors and encoder for the detection of position, with a centesimal precision.

The feed roller 9 is provided with a similar lifting system, but without independent adjustment to the thickness on its two sides.

As customary in roller coaters, the dosing of paint occurs through the pressure exerted by the dosing roller 11 on the applying roller 3; a stronger pressure decreases the quantity of applied paint. The speed of transport, too, affects the applied quantity in an unwanted way: in fact, a greater speed of the glass panes 8 generally causes an increase of the quantity of applied paint.

In roller coaters, typically the system for adjusting the quantity of applied paint occurs by varying the pressure applied to said dosing roller 11. On some roller coaters, the dosing roller rotates in reverse, i.e., opposite to the conveying direction, and this leads to a removing of paint from said roller, altering the adjustment of the dosing roller; both can influence the quantity of applied paint.

Figure 6:
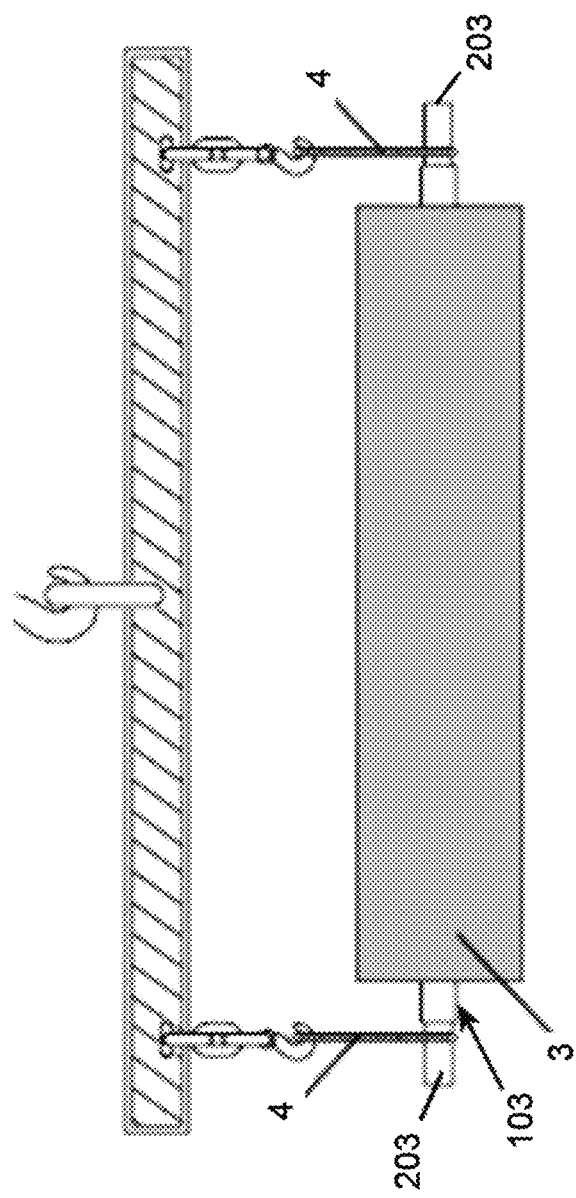
FIG. 6 is a front view of the lifting system for the applying roller.

FIG. 6 shows the lifting member of the applying roller 3 for its replacement. As already explained, said lifting member can be a bridge crane or a stacker suitably placed above said roller coater 1. The lifting member is independent from said roller coater 1.

Figure 7:
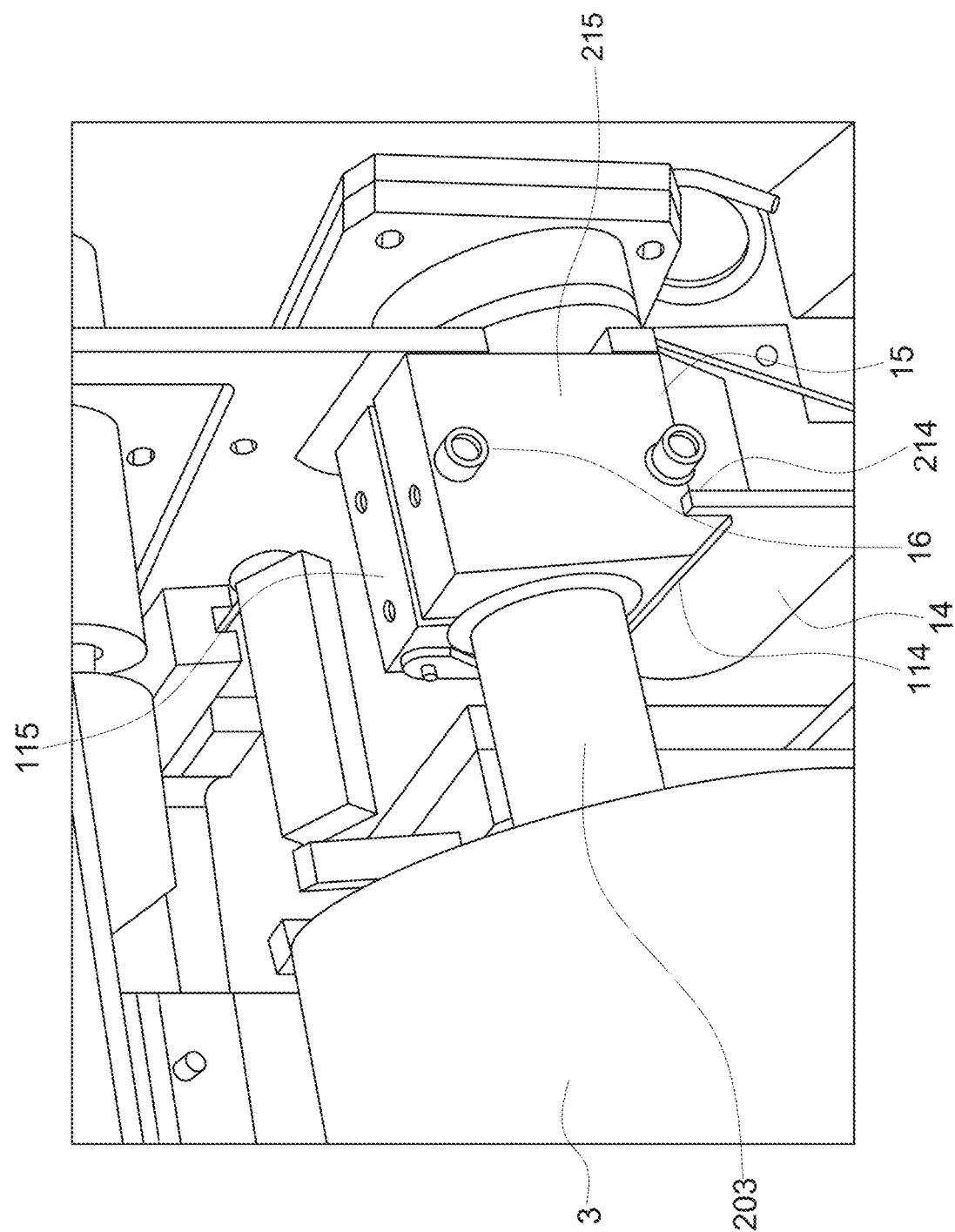
FIG. 7 is an axonometric view of a detail of the supporting system for the applying roller.

FIG. 7 shows a detail of the support for the applying roller 3. When in its working position, said applying roller 3 is held by suitable supports 15 that fix the ball bearings on which it rotates. When the applying roller 3 is replaced, said supports are unscrewed through screws 16 and said roller 3 slides, supported by suitable supports of the roller coater 1 in a position suitable for its lifting. In particular, FIG. 7 shows a bracket 14 which aims to prevent the fall of the roller 3 once its supports are removed.

Figure 9:
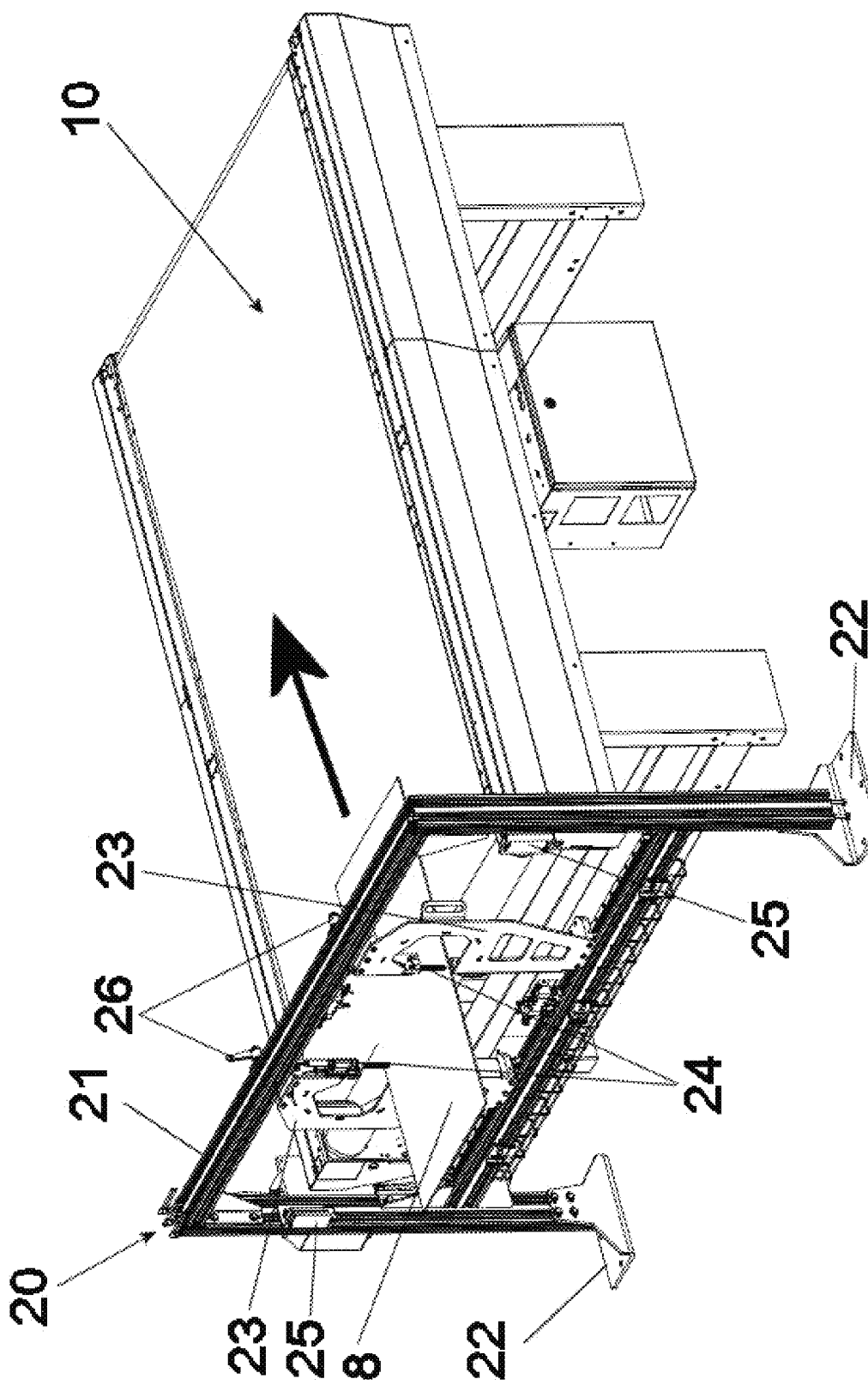
FIG. 9 is axonometric view of the bridge device and a conveyor.

FIG. 8 and FIG. 9 show the second embodiment of the present invention, in particular a bridge device 20 for measuring the thickness of glass panes 8. The two Figures show the preferred placement for the bridge device 20, i.e., upstream a closed belt conveying system 10 placed upstream said roller coater 1.

FIG. 8 shows a glass pane 8 that is inserted into the roller coater 1 through a closed belt conveyor 10 placed upstream said roller coater 1. The bold arrow shows the conveying direction of the glass panes 8.

Upstream said closed belt conveyor 10 there is provided a bridge device 20 according to the second embodiment of the present invention. Said bridge device allows to measure the thickness of glass panes 8 during their conveyance through said bridge device, so that the data are sent in real time to the roller coater 1, which adapts to the transmitted measures.

FIG. 9 shows an axonometric view of said bridge device 20, placed in proximity of the closed belt conveyor 10. The bold arrow shows the conveying direction of the glass panes 8.

Said bridge device 20 comprises:

A frame 21 provided with feet 22 for fixing it to the floor, so that the bridge device 20 is independent and can be placed in the most suitable points of the painting line. In this way, bumps and/or vibrations generated by the movement of the rotating organs are prevented, which might affect the precision of measuring;

Supports 23 supporting contact sensors; said supports can be slid in a direction which is perpendicular to the conveying direction of the panes 8 to be painted, in order to adapt their position to the transversal measure (width) of the glass pane 8;

Two contact measuring systems 24 (one for each side of the glass); said measuring systems 24 are divided into two parts, a top part and a bottom part with respect to the surface of the glass pane 8, and are both provided with a pneumatic cylinder, in its turn integral with an encoder detecting the displacement while leaning on the surface through an idle roller;

Transversal photocells 25, detecting the position of the glass pane 8 and its length;

Blocking knobs 26 for blocking said supports 23.

In fact, it is known that glass panes, especially when provided with a low thickness, are not provided with the same thickness on their right and left side, i.e., the sides parallel to the conveying direction of said panes 8. Said difference can be of some tenths of millimetre. As the application of paint on glasses, always destined to solar sector, is particularly delicate and requires an extreme precision, the working pressure of the applying roller 3 on the surface of the glass pane is very important for ensuring the uniformity of the paint layer.

Advantageously, the bridge device 20 is not a component of the roller coater 1 and is fixed to the floor, preventing problems due to vibrations of the roller coater 1 during measuring.

In this second embodiment, although the bridge device 20 is independent from the roller coater 1, nonetheless there is provided a communication system which includes a transmitter between the bridge device 20 and the PLC 27 of the roller coater 1, allowing to transmit the actual thickness data of each pane 8 to the application head of the roller coater 1 in real time.

Thanks to the use of the bridge device 20, the transversal position of the application head in the direction of width can be adjusted to the actual shape of the pane to be painted, in order to adapt it to the thickness difference between the two sides of the pane, using the above explained system with ball recirculating runners and brushless motor.

In short, the measuring of the thickness of glass panes 8 and the consequent painting of the glass panes 8 occurs as follows:

(a) The glass pane 8 conveyed in the painting line is intercepted by the photocells 25, activating the measuring systems 24;

(b) When the glass pane 8 detected by the photocells reaches the two measuring systems 24, said pneumatic cylinders bring said idle roller in contact with the top and bottom surfaces of the glass pane, and by value difference the actual thickness of the pane is measured;

(c) The measure is transmitted to the PLC 27 of the roller coater 1, which manages the positioning of the application head;

(d) Through two independent motorizations for positioning each of the two sides of the roller 3, said roller can be adjusted to the actual thickness of the glass pane, and with the working pressure optimal for a correct paint application on both sides;

(e) When the photocells 25 detect the end of the glass pane, they send a signal to the measuring systems 24, which deactivate.

The above description refers specifically to the use of said bridge device 20 for measuring the thickness of glass panes 8 inside a roller painting line for photovoltaic panels. The skilled man cannot miss the fact that any kind of mainly flat panel 8 can be painted in a line comprising the roller coater 1 according to the present invention, e.g., panels made of wood, plastics, fibrocement, etc. Similarly, the skilled man cannot miss the fact that the bridge device 20 according to the present invention can be used in a production line comprising machines of any type working in contact with a main surface of said panel 8, e.g., machines for cleaning said main surface, or sanders.

LIST OF REFERENCE NUMBERS 1 roller coater
2 cover
3 applying roller
4 strap
5 cover for the feed roller
6 cover
7 hinge
8 glass pane
9 feed roller
10 closed belt conveyor
11 dosing roller
12 rectified conveyor
13 ball recirculating runners system
14 bracket
15 support for the applying roller
16 screw
20 bridge device
21 frame
22 feet for fixing to floor
23 supports for measuring sensors
24 measuring system
25 transversal photocell
26 blocking knob
27 PLC
31 idle roller
32 motorized roller
33 contrast roller
39 contrast roller

The invention claimed is:

1. A bridge device for measuring a thickness of mainly flat panels to be placed in a production line for producing the panels, the production line comprising a plurality of machines placed in series, the bridge device comprising:
a frame provided with feet for fixing the bridge device to a floor;
a plurality of supports supporting measuring contact systems, the supports being slidable in a direction perpendicular to a conveying direction of panels so as to be adjustable for a transversal measuring of the panels;
a plurality of measuring systems, one for each panel's longitudinal side parallel to the conveying direction of panels;
a photocell detecting a position of the panel and a length thereof;
a plurality of blocking knobs for blocking the supports; and
a transmitter configured to transmit information on an actual thickness of each panel to a roller coater for applying paint to the mainly flat panels.

2. The bridge device according to claim 1, wherein the bridge device is provided in combination with the production line for producing the panels.

3. The bridge device according to claim 1, wherein the roller coater is provided with a Programmable Logic Controller (PLC) adjusting a position of an application head of the roller coater according to the thickness measured by the bridge device.

4. The bridge device according to claim 3, wherein the measuring systems are divided into two parts, of which one is placed over an upper surface and another under a lower surface of the panels.

5. The bridge device according to claim 4, wherein each measuring system is divided into a plurality of parts of which one is placed one over and another one under the panel, each part being provided with a pneumatic cylinder that is integral with an encoder detecting a displacement by leaning on the panel with an idle roller.

6. The bridge device according to claim 1, wherein the mainly flat panels are glass panes.

7. The bridge device according to claim 6, wherein the glass panes are photovoltaic panels.

8. A bridge device for measuring a thickness of mainly flat panels to be placed in a production line for producing the panels, the production line comprising a plurality of machines placed in series, the bridge device comprising:
a frame provided with feet for fixing the bridge device to a floor;
a plurality of supports supporting measuring contact systems, the supports being slidable in a direction perpendicular to a conveying direction of panels so as to be adjustable for a transversal measuring of the panels;
a plurality of measuring systems, one for each panel's longitudinal side parallel to the conveying direction of panels;
a photocell detecting a position of the panel and a length thereof;
a plurality of blocking knobs for blocking the supports; and
a transmitter configured to transmit information on an actual thickness of each panel to a sander of the mainly flat panels.

9. The bridge device according to claim 8, wherein the measuring systems are divided into two parts, of which one is placed over an upper surface and another under a lower surface of the panels.

10. The bridge device according to claim 8, wherein each measuring system is divided into a plurality of parts of which one is placed one over and another one under the panel, each part being provided with a pneumatic cylinder that is integral with an encoder detecting a displacement by leaning on the panel with an idle roller.

11. The bridge device according to claim 8, wherein the mainly flat panels are glass panes.

12. A bridge device for measuring a thickness of mainly flat panels to be placed in a production line for producing the panels, the production line comprising a plurality of machines placed in series, the bridge device comprising:
a frame provided with feet for fixing the bridge device to a floor;
a plurality of supports supporting measuring contact systems, the supports being slidable in a direction perpendicular to a conveying direction of panels so as to be adjustable for a transversal measuring of the panels;
a plurality of measuring systems, one for each panel's longitudinal side parallel to the conveying direction of panels;
a photocell detecting a position of the panel and a length thereof;

a plurality of blocking knobs for blocking the supports; and a transmitter configured to transmit information on an actual thickness of each panel.

13. The bridge device according to claim 12, wherein the measuring systems are divided into two parts, of which one is placed over an upper surface and another under a lower surface of the panels.

14. The bridge device according to claim 12, wherein each measuring system is divided into a plurality of parts of which one is placed one over and another one under the panel, each part being provided with a pneumatic cylinder that is integral with an encoder detecting a displacement by leaning on the panel with an idle roller.

15. The bridge device according to claim 12, wherein the mainly flat panels are glass panes.

\* \* \* \* \*